US012666753B2

(12) United States Patent
Sweetnam et al.

(10) Patent No.: US 12,666,753 B2
(45) Date of Patent: Jun. 23, 2026

(54) ULTRAVIOLET LIGHT SHIELDING ARTICLES AND SOLAR CELL COVERS INCLUDING THE SAME

(71) Applicant: 3M INNOVATIVE PROPERTIES COMPANY, St. Paul, MN (US)

(72) Inventors: Sean M. Sweetnam, Minneapolis, MN (US); Stephen P. Maki, North St. Paul, MN (US); Timothy J. Hebrink, Scandia, MN (US); David J. Rowe, Roseville, MN (US); Daniel M. Pierpont, North St. Paul, MN (US); Kevin W. Gotrik, Hudson, WI (US); James A. Phipps, River Falls, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 607 days.

(21) Appl. No.: 18/189,399

(22) Filed: Mar. 24, 2023

(65) Prior Publication Data

US 2024/0322052 A1    Sep. 26, 2024

(51) Int. Cl.
H10F 77/30        (2025.01)
G02B 1/10        (2015.01)

(52) U.S. Cl.
CPC ............. H10F 77/334 (2025.01); G02B 1/10 (2013.01)

(58) Field of Classification Search
CPC .................................................. H10F 77/334
See application file for complete search history.

(56) References Cited

U.S. PATENT DOCUMENTS

| | | | |
|---|---|---|---|
| 3,239,478 A | 3/1966 | Harlan, Jr. | |
| 3,935,338 A | 1/1976 | Robertson | |
| 4,181,752 A | 1/1980 | Martens et al. | |
| 4,293,732 A | 10/1981 | Rancourt et al. | |
| 4,696,719 A | 9/1987 | Bischoff | |

(Continued)

FOREIGN PATENT DOCUMENTS

| | | |
|---|---|---|
| CN | 209756346 U | 12/2019 |
| EP | 0632507 A2 | 1/1995 |

(Continued)

OTHER PUBLICATIONS

Affinito, "Polymer-Oxide Transparent Barrier Layers", Society of Vacuum Coaters, 39th Annual Technical Conference Proceedings, 1996, pp. 392-397.

(Continued)

*Primary Examiner* — Benjamin P Sandvik

(74) *Attorney, Agent, or Firm* — Adrian L. Pishko

(57) ABSTRACT

Ultraviolet light shielding articles are provided. An ultraviolet light shielding article includes a flexible substrate having a major surface and a multilayer optical film disposed on the major surface of the substrate. The multilayer optical film is comprised of at least a plurality of alternating first and second inorganic optical layers collectively reflecting and absorbing at an incident light angle of at least one of 0°, 15°, 30°, 45°, 60°, or 75°, an average of at least 50, 60, 70, 80, 90, or 95 percent of incident ultraviolet light over at least a 30-nanometer wavelength reflection bandwidth in a wavelength range from 190 nanometers (nm) to 400 nm. Solar cell covers including an ultraviolet shielding articles are also provided.

17 Claims, 1 Drawing Sheet

(56)                 References Cited

U.S. PATENT DOCUMENTS

| 4,722,515 | A | 2/1988 | Ham |
| 4,842,893 | A | 6/1989 | Yializis et al. |
| 4,952,650 | A | 8/1990 | Young et al. |
| 4,954,371 | A | 9/1990 | Yializis |
| 5,018,048 | A | 5/1991 | Shaw et al. |
| 5,032,461 | A | 7/1991 | Shaw et al. |
| 5,097,800 | A | 3/1992 | Shaw et al. |
| 5,125,138 | A | 6/1992 | Shaw et al. |
| 5,169,727 | A | 12/1992 | Boardman |
| 5,440,446 | A | 8/1995 | Shaw et al. |
| 5,449,413 | A | 9/1995 | Beauchamp et al. |
| 5,504,134 | A | 4/1996 | Palmer et al. |
| 5,547,908 | A | 8/1996 | Furuzawa et al. |
| 5,552,671 | A | 9/1996 | Parham et al. |
| 5,876,688 | A | 3/1999 | Laundon |
| 6,045,864 | A | 4/2000 | Lyons et al. |
| 6,214,422 | B1 | 4/2001 | Yializis |
| 6,231,939 | B1 | 5/2001 | Shaw et al. |
| 6,783,349 | B2 | 8/2004 | Neavin et al. |
| 8,557,378 | B2 | 10/2013 | Yamanaka et al. |
| 9,279,982 | B2 | 3/2016 | Hirose et al. |
| 9,285,584 | B2 | 3/2016 | Hebrink |
| 9,423,684 | B2 | 8/2016 | Maeshige et al. |
| 9,459,386 | B2 | 10/2016 | Hebrink et al. |
| 9,523,516 | B2 | 12/2016 | Hebrink et al. |
| 2009/0032098 | A1* | 2/2009 | Lu ........................ C03C 17/3417 |
| | | | 136/252 |
| 2009/0087629 | A1 | 4/2009 | Everaerts et al. |
| 2009/0089137 | A1 | 4/2009 | Minert et al. |
| 2010/0028564 | A1 | 2/2010 | Cheng et al. |
| 2010/0040842 | A1 | 2/2010 | Everaerts et al. |
| 2011/0126968 | A1 | 6/2011 | Determan et al. |
| 2011/0165394 | A1* | 7/2011 | Hirose .................... C23C 28/42 |
| | | | 428/212 |
| 2016/0059605 | A1* | 3/2016 | Schmidt ................. B41M 5/502 |
| | | | 156/60 |
| 2016/0209562 | A1* | 7/2016 | Hebrink ................... G02B 1/14 |
| 2024/0229227 | A1* | 7/2024 | Sweetnam .............. C23C 16/40 |

FOREIGN PATENT DOCUMENTS

| WO | 2000026973 | A1 | 5/2000 |
| WO | 2008128073 | A2 | 10/2008 |
| WO | 2018063961 | A1 | 4/2018 |
| WO | 2019130199 | A1 | 7/2019 |
| WO | 2019150236 | A1 | 8/2019 |
| WO | 2020070589 | A1 | 4/2020 |
| WO | 2021137125 | A1 | 7/2021 |
| WO | 2022243756 | A1 | 11/2022 |

OTHER PUBLICATIONS

Affinito, "Vacuum Deposited Polymer/Metal Multilayer Films for Optical Application", Thin Solid Films, Dec. 1995, vol. 270, No. 1-2, pp. 43-48.

PCT Application No. PCT/IB2023/053920 entitled, "Light Shielding Articles and Electromagnetic Receivers and/or Emitters Including the Same", filed Apr. 17, 2023, 52 pages.

Roehrig, "Use of Evaporated Acrylate Coatings to Smooth the Surface of Polyester and Polypropylene Film Substrates", Journal of Plastic Film & Sheeting, Jul. 1997, vol. 13, pp. 235-251.

Shaw, "A New High-Speed Process for Vapor Depositing Acrylate Thin Films: An Update", Society of Vacuum Coaters, 36th Annual Technical Conference Proceedings, 1993, pp. 348-351.

Shaw, "A New Vapor Deposition Process for Coating Paper and Polymer Webs", Technical Paper Presented at 6th International Vacuum Coating Conference, Oct. 1992, pp. 18-24.

Shaw, "Use of Vapor Deposited Acrylate Coatings to Improve the Barrier Properties of Metallized Film", Society of Vacuum Coaters, 37th Annual Technical Conference Proceedings, 1994, pp. 240-247.

* cited by examiner

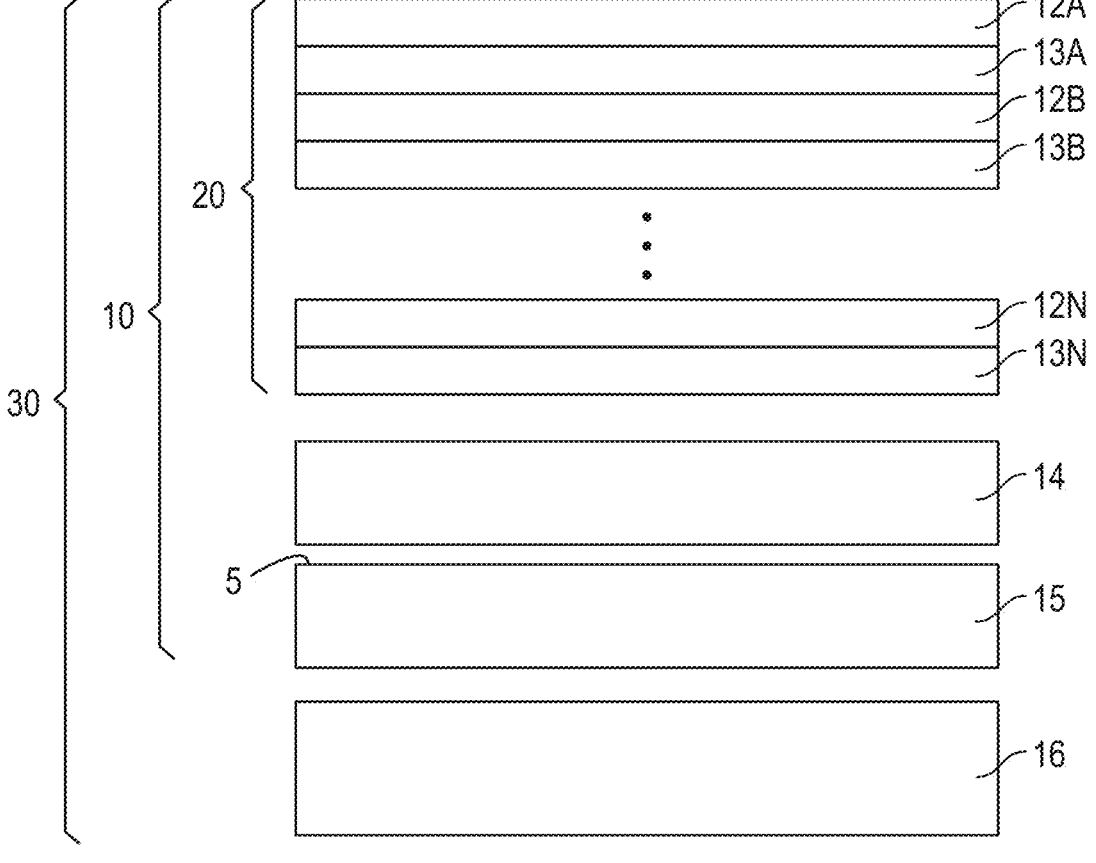

ULTRAVIOLET LIGHT SHIELDING ARTICLES AND SOLAR CELL COVERS INCLUDING THE SAME

This invention was made with Government support under Cooperative Agreement FA8649-21-P-0836. The Government has certain rights in this invention.

CROSS REFERENCE TO RELATED APPLICATIONS

This application claims priority from U.S. Provisional Application Ser. No. 63/343,679, filed May 19, 2022 and U.S. Provisional Application Ser. No. 63/416,681, filed Oct. 17, 2022, the disclosure of which is incorporated by reference in their entirety herein.

BACKGROUND

There is a class of telecommunications network with infrastructure provided by constellations of thousands of small satellites deployed in low earth orbit. These satellites require power via solar cells mounted to their frames and these solar cells in turn require protection from the harsh environment of low earth orbit.

The devices typically operate at altitudes ranging from 20-2000 km, where the thin atmosphere absorbs little solar radiation. The high-altitude devices are thus exposed to the more intense AM0 solar spectrum and to a higher intensity of ultraviolet (UV) radiation, particularly UV-C radiation, than is present in the AM1.5 solar spectrum encountered in Earth terrestrial conditions.

SUMMARY

In a first aspect, an ultraviolet light shielding article is provided. The ultraviolet light shielding article comprises a) a flexible substrate having a major surface; and b) a multilayer optical film disposed on the major surface of the substrate. The multilayer optical film is comprised of at least a plurality of alternating first and second inorganic optical layers collectively reflecting and absorbing at an incident light angle of at least one of $0°$, $15°$, $30°$, $45°$, $60°$, or $75°$, an average of at least 50, 60, 70, 80, 90, or 95 percent of incident ultraviolet light over at least a 30-nanometer wavelength reflection bandwidth in a wavelength range from 190 nanometers (nm) to 400 nm.

In a second aspect, a solar cell cover is provided. The solar cell cover includes an ultraviolet light shielding article according to the first aspect.

Broadband UV protection is of particular interest. Alternating layers of high and low index materials have been shown to provide UV rejection, but these are often limited to relatively narrow bands of reflection. UV absorbers, on the other hand, are often not able to provide sufficient absorption without thick layers, and many solutions are made with organic absorbers which do not always survive higher energy UVC light and atomic oxygen which are present in low earth orbit.

Ultraviolet light shielding articles according to at least certain embodiments of the present disclosure provide an inorganic based solution that combines the UV absorption of inorganic materials (e.g., titanium oxide or niobium oxide) with a reflection band created by alternating high and low index materials. This creates a broadband UV rejection filter that is durable to both UV and atomic oxygen. This technology could potentially replace the incumbent protective solution for solar cells in space, cover glass. The use of cover glass is expensive due to the fragile nature of glass slides, as well as the small size of glass slides that require a lot of trimming/laminating.

Various unexpected results and advantages are obtained in exemplary embodiments of the disclosure. One such advantage of exemplary embodiments of the present disclosure is that the combination of UV absorption and reflection in the ultraviolet light shielding articles creates a broadband UV rejection filter made from durable inorganic materials that can survive in low earth orbit conditions. The layers can be sputter deposited or evaporated in a roll-to-roll process. As such, a further advantage of exemplary embodiments is to enable a high speed, roll-to-roll continuous production process for the ultraviolet light shielding article of the present disclosure.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying FIGURE, in which:

FIG. 1 is a schematic cross-sectional view of an exemplary ultraviolet light shielding article 10 and an exemplary solar cell cover 30, according to various exemplary embodiments disclosed herein.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should be understood that:

The term "fluoropolymer" refers to any organic polymer containing fluorine.

The term "nonfluorinated" means not containing fluorine.

The terms "(co)polymer" or "(co)polymers" includes homo(co)polymers and (co)polymers, as well as homo(co) polymers or (co)polymers that may be formed in a miscible blend, (e.g., by coextrusion or by reaction, including, (e.g., transesterification)). The term "(co)polymer" includes random, block and star (co)polymers.

As used herein, "adjacent" encompasses both in direct contact (e.g., directly adjacent) and having one or more intermediate layers present between the adjacent materials.

As used herein, "incident" with respect to light refers to the light falling on or striking a material.

The term "crosslinked" (co)polymer refers to a (co)polymer whose (co)polymer chains are joined together by covalent chemical bonds, usually via crosslinking molecules or groups, to form a network (co)polymer. A crosslinked (co)polymer is generally characterized by insolubility but may be swellable in the presence of an appropriate solvent.

The term "cure" refers to a process that causes a chemical change, (e.g., a reaction that creates a covalent bond to solidify a multilayer film layer or increase its viscosity.

The term "cured (co)polymer" includes both crosslinked and uncrosslinked (co)polymers.

The term "metal" includes a pure metal or a metal alloy.

The term "film" or "layer" refers to a single stratum within a multilayer film.

The term "(meth)acryl" or "(meth)acrylate" with respect to a monomer, oligomer, (co)polymer or compound means a vinyl-functional alkyl ester formed as the reaction product of an alcohol with an acrylic or a methacrylic acid.

The term "optically clear" refers to an article in which there is no visibly noticeable distortion, haze or flaws as detected by the naked eye at a distance of about 1 meter, preferably about 0.5 meters.

The term "optical thickness" when used with respect to a layer refers to the physical thickness of the layer times its in-plane index of refraction.

The term "vapor coating" or "vapor depositing" means applying a coating to a substrate surface from a vapor phase, for example, by evaporating and subsequently depositing onto the substrate surface a precursor material to the coating or the coating material itself. Exemplary vapor coating processes include, for example, physical vapor deposition (PVD), chemical vapor deposition (CVD), and combinations thereof.

By using terms of orientation such as "atop", "on", "over," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture, or in interpreting the claims.

As used herein, "radiation" refers to electromagnetic radiation unless otherwise specified.

As used herein, "scattering" with respect to wavelengths of light refers to causing the light to depart from a straight path and travel in different directions with different intensities.

As used herein, "reflectance" is the measure of the proportion of light or other radiation striking a surface at normal incidence which is reflected off it. Reflectivity typically varies with wavelength and is reported as the percent of incident light that is reflected from a surface (0 percent—no reflected light, 100—all light reflected). Reflectivity and reflectance are used interchangeably herein.

As used herein, "reflective" and "reflectivity" refer to the property of reflecting light or radiation, especially reflectance as measured independently of the thickness of a material.

As used herein, "average reflectance" refers to reflectance averaged over a specified wavelength range.

As used herein, "absorption" refers to a material converting the energy of light radiation to internal energy.

As used herein, "absorb" with respect to wavelengths of light encompasses both absorption and scattering, as scattered light also eventually gets absorbed. Absorbance can be measured with methods described in ASTM E903-12 "Standard Test Method for Solar Absorptance, Reflectance, and Transmittance of Materials Using Integrating Spheres". Absorbance measurements described herein were made by making transmission measurements as previously described and then calculating absorbance using Equation 1.

As used herein, the term "absorbance" with respect to a quantitative measurement refers to the base 10 logarithm of a ratio of incident radiant power to transmitted radiant power through a material. The ratio may be described as the radiant flux received by the material divided by the radiant flux transmitted by the material. Absorbance (A) may be calculated based on internal transmittance (T) according to Equation 1:

$$A = -\log_{10} T \tag{1}$$

Emissivity can be measured using infrared imaging radiometers with methods described in ASTM E1933-14 (2018) "Standard Practice for Measuring and Compensating for Emissivity Using Infrared Imaging Radiometers." According to Kirchhoff's law of thermal radiation, absorbance correlates with emittance. Absorbance, absorptivity, emissivity, and emittance are used interchangeably herein for the same purpose of emitting infrared energy to the atmosphere. Absorb and emit are also used interchangeably herein.

As used herein, the terms "transmittance" and "transmission" refer to the ratio of total transmission of a layer of a material compared to that received by the material, which may account for the effects of absorption, scattering, reflection, etc. Transmittance (T) may range from 0 to 1 or be expressed as a percentage (T %).

As used herein, "transparent" refers to a material (e.g., film or layer) that absorbs less than 20% of light having wavelengths between 350 nm and 2500 nm.

As used herein, "bandwidth" refers to a width of a contiguous band of wavelengths.

As used herein, the term "flexible" refers to being capable of being bent around a roll core with a radius of curvature of up to 7.6 centimeters (cm) (3 inches), in some embodiments up to 6.4 cm (2.5 inches), 5 cm (2 inches), 3.8 cm (1.5 inch), or 2.5 cm (1 inch). In some embodiments, the flexible assembly can be bent around a radius of curvature of at least 0.635 cm (¼ inch), 1.3 cm (½ inch) or 1.9 cm (¾ inch).

The terms "about" or "approximately" with reference to a numerical value or a shape means+/−five percent of the numerical value or property or characteristic, but expressly includes the exact numerical value.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g., visible light) than it fails to transmit (e.g., absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

By definition, the total weight percentages of all ingredients in a composition equals 100 weight percent.

Various exemplary embodiments of the disclosure will now be described. Exemplary embodiments of the present disclosure may take on various modifications and alterations without departing from the spirit and scope of the present disclosure. Accordingly, it is to be understood that the embodiments of the present disclosure are not to be limited to the following described exemplary embodiments but is to be controlled by the limitations set forth in the claims and any equivalents thereof.

Ultraviolet Light Shielding Article

In a first aspect, an ultraviolet light shielding article is provided. The ultraviolet light shielding article comprises: a) a flexible substrate having a major surface; and b) a multilayer optical film disposed on the major surface of the substrate, wherein the multilayer optical film is comprised of at least a plurality of alternating first and second inorganic optical layers collectively reflecting and absorbing at an incident light angle of at least one of 0°, 15°, 30°, 45°, 60°, or 75°, an average of at least 50, 60, 70, 80, 90, or 95 percent of incident ultraviolet light over at least a 30-nanometer wavelength reflection bandwidth in a wavelength range from 190 nanometers (nm) to 400 nm.

Referring now to FIG. 1, the present disclosure describes ultraviolet light shielding articles 10 including a flexible substrate 15 having a first major surface 5 and a multilayer optical film 20 positioned on the first major surface substrate 5 of the flexible substrate 15. In some cases, the multilayer optical film 20 is disposed directly on the first major surface substrate 5 of the flexible substrate 15 (e.g., attached directly to the substrate 15), whereas in other cases at least one intermediate layer 14 is positioned between the flexible substrate 15 and the multilayer optical film 20. Suitable intermediate layers 14 include for instance and without limitation, tie layers, organic base coat layers, barrier layers, or any combination thereof.

The multilayer optical film 20 includes is comprised of at least a plurality of alternating first inorganic optical layers 13 (A-N) and second inorganic optical layers 12 (A-N).

The plurality of alternating first and second inorganic optical layers collectively reflect and absorb at an incident light angle of at least one of 0°, 15°, 30°, 45°, 60°, or 75°, an average of at least 50, 60, 70, 80, 90, or 95 percent (preferably at least 80, 90, or 95 percent) of incident ultraviolet light over at least a 30-nanometer wavelength reflection bandwidth in a wavelength range from 190 nanometers (nm) to 400 nm.

In some cases, the plurality of alternating first and second inorganic optical layers collectively reflect and absorb at an incident light angle of at least one of 0°, 15°, 30°, 45°, 60°, or 75°, an average of at least 60, 70, 80, 90, or 95 percent of incident ultraviolet light over at least a 30-nanometer wavelength reflection bandwidth in a wavelength range from 190 nm to 240 nm, 240 nm to 300 nm, 300 nm to 350 nm, 350 nm to 400 nm, or any combination thereof.

Optionally, the plurality of alternating first and second inorganic optical layers collectively reflect and absorb at an incident light angle of at least one of 0°, 15°, 30°, 45°, 60°, or 75°, an average of at least 60, 70, 80, 90, or 95 percent of incident ultraviolet light over a greater wavelength reflection bandwidth than at least 30-nanometer, for instance at least a 50-nanometer, 75-nanometer, 100-nanometer, 125-nanometer, 150-nanometer, or 175-nanometer wavelength reflection bandwidth in a wavelength range from 190 nm to 400 nm.

As the plurality of alternating first and second inorganic optical layers collectively reflect and absorb, some portion of the incident ultraviolet light may be absorbed and some portion reflected. In some cases, the alternating first and second inorganic optical layers collectively absorb at an incident light angle of at least one of 0°, 15°, 30°, 45°, 60°, or 75°, an average of at least 30, 40, 50, 60, 70, 80, 90, or 95 percent of incident light over at least a 30-nanometer wavelength bandwidth in a wavelength range from 190 nm to less than 350 nm. In some cases, the alternating first and second inorganic optical layers collectively reflect at an incident light angle of at least one of 0°. 15°, 30°, 45°, 60°, or 75°, an average of at least 30, 40, 50, 60, 70, 80, 90, or 95 percent of incident light over at least a 30-nanometer wavelength bandwidth in a wavelength range from 190 nm to less than 400 nm, 190 nm to 240 nm, 240 nm to 300 nm, 300 nm to 350 nm, 350 nm to less than 400 nm, or any combination thereof.

In select embodiments of the ultraviolet light shielding article, the alternating first and second inorganic optical layers collectively transmit at an incident light angle of at least one of 0°, 15°, 30°, 45°, 60°, or 75°, an average of at least 50, 60, 70, 80, 90, or 95 percent of incident visible light in a wavelength range from greater than 400 nm to 700 nm.

In select embodiments of the ultraviolet light shielding article, the outermost inorganic layer is a second inorganic optical layer (e.g., 12A in FIG. 1) and has a thickness of at least 70 nm. This has the effect of reducing the amount of light reflected off the outer surface of the light shielding article and increases the light transmitted between 400 nm and 700 nm, which is particularly useful when the ultraviolet light shielding article is used in a solar cell cover application, to allow visible light to reach the solar cell.

In select embodiments of the ultraviolet light shielding article at least one of the first optical layers nearest to the exterior of the film (e.g., 13A in FIG. 1) or nearest to the substrate (e.g., 13N in FIG. 1) has a thickness of at most 95%, 90%, 85%, or at most 80% of the other first optical layers. This has the effect of reducing the amount of light reflected off the outer surface of the light shielding article between 400 nm and 700 nm, which is particularly useful when the ultraviolet light shielding article is used in a solar cell cover application, to allow visible light to reach the solar cell. In some embodiments, the ultraviolet light shielding article (e.g., as a whole) transmits at an incident light angle of at least one of 0°, 15°, 30°, 45°, 60°, or 75°, an average of at least 50, 60, 70, 80, 90, or 95 percent of incident visible light in a wavelength range from greater than 400 nm to 700 nm. Transmitting such amounts of incident visible light is particularly useful when the ultraviolet light shielding article is used in a solar cell cover application, to allow visible light to reach the solar cell. Additionally, ultraviolet light shielding articles according to certain preferred embodiments of the present disclosure exhibit an average transmission of wavelengths between 400 nm and 700 nm through the article being reduced by less than 20%, 10%, 5%, or less than 1% after exposure to a certain dose of ultraviolet light (e.g., in units of Joules per square centimeter ($J/cm^2$)). For instance, exposed to the doses mentioned in the Examples below.

Substrates

As mentioned above, the substrate is a flexible substrate (as defined in the Glossary). An advantage to employing a flexible substrate is avoiding the high cost of working with rigid glass, particularly small pieces of glass, which can break during handling and require significant labor due to the need to apply many small pieces of glass. Additionally, in some embodiments according to the present disclosure flexible substrates are used in roll-to-roll processing of manufacturing the ultraviolet light shielding article. An advantage to roll-to-roll manufacturing is that the ultraviolet light shielding article can be made in large area form factors. In some cases, the substrate (or the ultraviolet light shielding article) has an area of at least 50 square centimeters, such as at least 60, 70, 80, 90, or at least 100 square centimeters.

In any of the foregoing embodiments, the flexible substrate 15 may be comprised of or consist of a polymeric material, such as a (co)polymer. In some exemplary embodiments, the substrate comprises polyethylene terephthalate (PET), a crosslinked polysiloxane, a silicone thermoplastic polymer, a crosslinked urethane, a thermoplastic urethane, a crosslinked (meth)acrylate, PMMA, coPMMA, a polyimide, a cyclic olefin copolymer, a cyclic olefin polymer, a polycarbonate, a polyethylene naphthalate (PEN), or a fluoropolymer (co)polymer comprising polymerized units derived from one or more monomers selected from tetrafluoroethylene, hexafluoropropylene, vinylidene fluoride, a perfluoroalkoxy alkylene, a vinyl fluoride, or a combination thereof.

Suitable polyimide substrates are available under the trade name "KAPTON" from E. I. DuPont de Nemours, Wilmington, DE, of which "KAPTON CS100" is currently preferred. Suitable PMMA polymers include those available as CP71 and CP80 from Ineos Acrylics, Inc., Wilmington, DE. One suitable polycarbonate substrate is available under the trade name "Makrofol", from Bayer AG (Darmstadt, Germany). Suitable methyl methacrylate copolymers (CoPMMA) include, for instance, a CoPMMA made from 75 wt. % methylmethacrylate (MMA) monomers and 25 wt. % ethyl acrylate (EA) monomers, (available, for example, from Ineos Acrylics, Inc. (London, England) under the trade designation "PERSPEX CP63" or Arkema Corp., (Philadelphia, PA) under the trade designation "ATOGLAS 510"), a CoPMMA formed with MMA comonomer units and n-butyl methacrylate (nBMA) comonomer units, or a blend of PMMA and poly(vinylidene fluoride) (PVDF). Suitable polyethylene naphthalate (PEN) polymers are available under the tradename "Teonex Q51" from DuPont Teijin, Chester, VA.

In certain exemplary embodiments, the fluorinated (co) polymer preferably comprises tetrafluoroethylene, hexafluoropropylene, vinylidene fluoride, a perfluoroalkoxy alkane, or a combination thereof. Suitable fluoropolymer substrates are available under the trade name "TEFLON FEP100" from E. I. DuPont de Nemours, Wilmington, DE, or which "TEFLON FEP100 500A" is currently preferred. Suitable exemplary fluoropolymers also include copolymers of tetrafluoroethylene, hexafluoropropylene, and vinylidene fluoride (THV) under the trade designations "DYNEON THV 220," "DYNEON THV 221," "DYNEON THV 230," "DYNEON THV 2030," "DYNEON THV 415", "DYNEON THV 500", "DYNEON THV 610", and "DYNEON THV 815" from Dyncon LLC, Oakdale, MN.

In some applications, it may be useful to employ a low coefficient of thermal expansion (CTE) substrate, for instance when the article will be subjected to large variations in ambient temperature. Some exemplary low CTE polymers for use in a substrate include for instance and without limitation, polyimide, heat stabilized PEN, and PET. Preferably, a low CTE substrate has a CTE of 80 parts per million per kelvin (ppm/K) or lower, 70 ppm/K, 60 ppm/K, 50 ppm/K, 40 ppm/K, 30 ppm/K, or even 25 ppm/K or less. The coefficient of thermal expansion has the general meaning as employed in the art, i.e., as determined using ASTM E831.

The smoothness and adhesion of layers to the substrate can be enhanced by appropriate optional pretreatment of the substrate or optional application of a priming layer. Methods for surface modification are known in the art. In one embodiment, a pretreatment regimen involves electrical discharge pretreatment of the substrate in the presence of a reactive or non-reactive atmosphere (e.g., plasma, glow discharge, corona discharge, dielectric barrier discharge or atmospheric pressure discharge), chemical pretreatment, or flame pretreatment. These pretreatments can help ensure that the surface of the substrate will be receptive to the subsequently applied layers. In one embodiment, the method can include plasma pretreatment. For organic surfaces, plasma pretreatments can include nitrogen or water vapor. Another pretreatment regimen involves coating the substrate with an inorganic or organic base coat layer optionally followed by further pretreatment using plasma or one of the other pretreatments described above.

Preferably, the substrate transmits an average of at least 70, 80, 90, or 95 percent of incident visible light in a wavelength range from greater than 400 nm to 700 nm.

Optional Organic Base Coat Layer

In another embodiment, optional organic base coat layers, and especially base coat layers based on crosslinked acrylate (co)polymers, may be advantageously employed on the substrate. The base coat layer can be formed by flash evaporation and vapor deposition of a radiation-crosslinkable monomer (e.g., an acrylate monomer), followed by crosslinking in situ (using, for example, an electron beam apparatus, UV light source, electrical discharge apparatus or other suitable device), as described in U.S. Pat. Nos. 4,696, 719, 4,722,515, 4,842,893, 4,954,371, 5,018,048, 5,032,461, 5,097,800, 5,125,138, 5,440,446, 5,547,908, 6,045,864, 6,231,939 and 6,214,422: in published PCT Application No. WO 00/26973: in D. G. Shaw and M. G. Langlois, "A New Vapor Deposition Process for Coating Paper and (co)polymer Webs", 6th International Vacuum Coating Conference (1992): in D. G. Shaw and M. G. Langlois, "A New High Speed Process for Vapor Depositing Acrylate Thin Films: An Update", Society of Vacuum Coaters 36th Annual Technical Conference Proceedings (1993): in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994): in D. G. Shaw, M. Rochrig, M. G. Langlois and C. Shechan, "Use of Evaporated Acrylate Coatings to Smooth the Surface of Polyester and Polypropylene Film Substrates", RadTech (1996): in J. Affinito, P. Martin, M. Gross, C. Coronado and E. Greenwell, "Vacuum deposited (co)polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "(co)polymer-Oxide Transparent Barrier Layers", Society of Vacuum Coaters 39th Annual Technical Conference Proceedings (1996).

If desired, the base coat can also be applied using conventional coating methods such as roll coating (e.g., gravure roll coating) or spray coating (e.g., electrostatic spray coating), then crosslinked using, for example, heat, UV radiation or an electron beam. The desired chemical composition and thickness of the base coat layer will depend in part on the nature of the substrate. For example, for a PET substrate, the base coat layer can be formed from an acrylate monomer and may for example have a thickness of only a few nm up to about 7 micrometers.

Optional Transparent Adhesive Tie Layer

Suitable transparent adhesives for one or more tie layers (e.g., intermediate layer 14) include for instance, pressure sensitive adhesives. Classes of suitable pressure sensitive adhesives include acrylics, tackified rubber, tackified synthetic rubber, ethylene vinyl acetate, silicones, and the like. Suitable acrylic adhesives are disclosed, for example, in U.S. Pat. No. 3,239,478 (Harlan): U.S. Pat. No. 3,935,338 (Robertson): U.S. Pat. No. 5,169,727 (Boardman): U.S. Pat. No. 4,952,650 (Young et al.) and U.S. Pat. No. 4,181,752 (Martens et al.), incorporated herein by reference.

In select embodiments, the transparent adhesive is optically clear, which means that the adhesive has both transparency and clarity (e.g., low haze). In certain embodiments, an optically clear adhesive (OCA) is selected from an acrylate, a polyurethane, a polyolefin (such as a polyisobutylene (PIB)), a silicone, or a combination thereof. Illustrative OCAs include those described in International Pub. No. WO 2008/128073 (Everaerts et al.) relating to antistatic optically clear pressure sensitive adhesives, U.S. Pat. App. Pub. Nos. US 2009/089137 (Sherman et al.) relating to stretch releasing OCA, US 2009/0087629 (Everaerts et al.) relating to indium tin oxide compatible OCA, US 2010/0028564 (Cheng et al.) relating to antistatic optical constructions having optically transmissive adhesive, US 2010/0040842 (Everaerts et al.) relating to adhesives compatible with corrosion sensitive layers, US 2011/0126968 (Dolezal et al.) relating to optically clear stretch release adhesive tape, and U.S. Pat. No. 8,557,378 (Yamanaka et al.) relating to stretch release adhesive tapes. Suitable OCAs include acrylic optically clear pressure sensitive adhesives such as, for example, 3M OCA 8146, 8211, 8212, 8213, 8214, and 8215, each available from 3M Company, St. Paul, MN.

In some embodiments, the transparent adhesive may be resistant to ultraviolet radiation damage. Exemplary adhesives which are typically resistant to ultraviolet radiation damage include silicone adhesives and acrylic adhesives containing UV-stabilizing/blocking additive(s), for example. U.S. Pat. No. 5,504,134 (Palmer et al.), for instance, describes attenuation of polymer substrate degradation due to ultraviolet radiation through the use of metal oxide particles in a size range of about 0.001 to about 0.2 micrometers (in some embodiments, about 0.01 micrometers to about 0.15 micrometers) in diameter. U.S. Pat. No. 5,876, 688 (Laundon), describes a method for producing micronized zinc oxide that are small enough to be transparent when incorporated as UV blocking and/or scattering agents in paints, coatings, finishes, plastic articles, cosmetics and the like which are well suited for use in the present invention. These fine particles such as zinc oxide and titanium oxide with particle sizes ranging from 10 nm to 100 nm that can attenuate UV radiation are available, for example, from Kobo Products, Inc., South Plainfield, NJ.

Multilayer Optical Films

Referring again to FIG. 1, the ultraviolet light shielding article 10 includes a multilayer optical film 20 comprising at least a plurality of alternating first inorganic optical layers 13 (A-N) and second inorganic optical layers 12 (A-N) positioned on the first major surface 5 of the flexible substrate 15 as described further below.

Typically, the multilayer optical film has a thickness of 200 nm or greater, 250 nm, 300 nm, 350 nm, 400 nm, 500 nm, or 550 nm or greater; and 900 nm or less, 850 nm. 800 nm, 750 nm, 700 nm, 650 nm, or 600 nm or less, such as a thickness of 200 nm to 900 nm.

Inorganic Layers

In some cases, the first optical layer comprises at least one of niobium oxide, titanium oxide, silicon oxynitride, molybdenum oxide, tungsten oxide, silicon nitride, indium tin oxide, hafnium oxide, tantalum oxide, zirconium oxynitride, zirconium oxide, aluminum zinc oxide, or zinc oxide. Alloys of oxides may be suitable, as known to those skilled in the art. In some cases, the second optical layer comprises at least one of silicon oxide, aluminum oxide, aluminum fluoride, magnesium fluoride, calcium fluoride, indium tin oxide, or zinc oxide. In select embodiments, the first optical layer comprises at least one of niobium oxide or titanium oxide, and the second optical layer comprises silicon oxide. When a photoactive inorganic material such as titanium oxide is employed, typically a non-photoactive material (e.g., silicon oxide, aluminum oxide, etc.) may be disposed between the photoactive inorganic material and any organic layers to minimize degradation of the organic layer. For instance, referring again to FIG. 1, a layer of a non-photoactive material could be an intermediate layer 14 located between the first optical layer 13N and the substrate 15.

It was unexpectedly discovered that wavelengths of light in each of UVA, UVB, and UVC regions could be shielded from a substrate using just the combined reflectance and absorbance of a plurality of alternating first inorganic optical layers and second inorganic optical layers, typically while still maintaining an acceptable amount of transmission of visible light (e.g., at least 50% of incident visible light).

Optical thin film stack designs comprised of alternating thin layers of inorganic dielectric materials with refractive index contrast, are particularly suited for the multilayer optical film. In recent decades they have been used for applications in UV, Visible, NIR and IR spectral regions. Depending upon the spectral region of interest, there are specific materials suitable for that region. Also, for coating these materials, one of two forms of physical vapor deposition (PVD) are used: evaporation or sputtering. Evaporated coatings rely upon heating the coating material (evaporant) to a temperature at which it evaporates. This is followed by condensation of the vapor upon a substrate. For evaporated dielectric mirror coatings, the electron-beam deposition process is most commonly used. Sputtered coatings use energetic gas ions to bombard a material ("target") surface, ejecting atoms which then condense on the nearby substrate. Depending upon which coating method is used, and the settings used for that method, thin film coating rate and structure-property relationships will be strongly influenced. Ideally, coating rates should be high enough to allow acceptable process throughput and film performance, characterized as dense, low stress, void free, non-optically absorbing coated layers.

The number of optical layers is selected to achieve the desired optical properties using the minimum number of layers for reasons of film thickness, flexibility and economy. One skilled in the art could extend such deposition techniques to include CVD, ALD, and other vapor depositions. Typically, the total number of layers is preferably 21 or less, 19, 17, 15, or 13 optical layers or less; and 3 optical layers or more, 5, 7, 9, or 11 optical layers or more, may be needed.

The thickness of each of the first and second optical layers can vary substantially. For instance, in some cases each of the first optical layers and each of the second optical layers independently has a thickness of 5 nm or greater, 10 nm, 15 nm, 20 nm, 25 nm, 30 nm, 35 nm, 40 nm, 45 nm, 50 nm, 55 nm, 60 nm, 65 nm, or 70 nm or greater; and a thickness of 2000 nm or less, 50 nm, 145 nm, 140 nm, 135 nm, 130 nm, 125 nm, 120 nm, 115 nm, 110 nm, 105 nm, 100 nm, 95 nm, 90 nm, 85 nm, 80 nm, or 75 nm or less.

Multilayer optical films described herein can be made using general processing techniques, such as those described in U.S. Pat. No. 6,783,349 (Neavin et al.), the entire disclosure of which is incorporated herein by reference in its entirety.

For manufacturing inorganic coatings, the electron beam process is best suited for coating discrete parts. Optionally, ultraviolet light shielding articles can be prepared in continuous roll-to-roll (R2R) fashion for larger articles. Though some chambers have demonstrated R2R film coating, the layer by layer coating sequence would still be necessary. For R2R sputtering of inorganic layers of ultraviolet light shielding articles 10, it is advantageous to use a sputtering system with multiple sources located around one, or perhaps two, coating drums. Here, for a thirteen layers optical stack design, a two, or even single, machine pass process, with alternating high and low refractive index layers coated sequentially, would be feasible. How many machine passes needed would be contingent upon machine design, cost, practicality of thirteen consecutive sources, and the like. Additionally, coating rates would need to be matched to a single film line speed.

The film roll transport initially starts at a pre-determined speed, and the sputter source power is ramped to full operating power, followed by introduction of the reactive gases and then achieving steady state condition. Depending upon the length of film to coat, the process continues until total footage is achieved. Here, as the sputter source is orthogonal to and wider than the film which is being coated, the uniformity of coating thickness is quite high. Upon reaching the desired length of coated film the reactive gases are set to zero and the target is sputtered to a pure metal surface state. The film direction is next reversed and a rotary pair of sputter targets has AC frequency (40 kHz) power applied in an argon sputtering atmosphere. Upon reaching steady state, oxygen reactive gas is introduced to provide transparency and low refractive index. At the pre-determined process setting and line speed the second layer is coated over the length which was coated for layer one. Again, as these sputter sources are also orthogonal to and wider than the film being coated, the uniformity of coating thickness is quite high. After reaching the desired length of coated film the reactive oxygen is removed and the target is sputtered in argon to a pure metal surface state. Layers three to five (or seven or nine, eleven or thirteen, etc.) depending upon optical targets, are coated in this sequence. Upon completion, the film roll is removed for post-processing.

The Examples describe in more detail exemplary processes to make exemplary ultraviolet light shielding articles 10.

Solar Cell Covers

In a second aspect, a solar cell cover is provided. The solar cell cover includes an ultraviolet light shielding article according to any embodiments of the first aspect described in detail above.

One of the promising energy resources today is sunlight. Harnessing sunlight may be accomplished by the use of photovoltaic (PV) cells (also referred to as solar cells), which are used for photovoltaic conversion of sunlight to electrical current. Solar cells are relatively small in size and typically combined into a physically integrated solar module (or PV module) having a correspondingly greater power output than the individual solar cells of the module. Solar modules are generally formed from two or more "strings" of solar cells surrounded by an encapsulant and enclosed by front and back panels, wherein at least one panel is transparent to sunlight.

Ultraviolet shielding articles according to the present disclosure may thus be used to protect solar cells by being included in the solar cell covers (e.g., front and/or back panels).

Referring again to FIG. 1, the present disclosure describes solar cell covers 30 each including an ultraviolet light shielding article 10 positioned on a solar cell panel 16. In some cases, the ultraviolet light shielding article 10 may be directly attached to the solar cell panel 16, e.g., by using heat lamination. There may instead be one or more optional intermediate layers (not shown) between the ultraviolet light shielding article 10 and the solar cell panel 16, such as a transparent adhesive tie layer. The ultraviolet light shielding article 10 includes a flexible substrate 15 having a first major surface 5 and a multilayer optical film 20 positioned on the first major surface substrate 5 of the flexible substrate 15.

Listing of Exemplary Embodiments

In a first embodiment is provided an ultraviolet light shielding article. The ultraviolet light shielding article comprises a flexible substrate having a major surface and a multilayer optical film disposed on the major surface of the substrate. The multilayer optical film is comprised of at least a plurality of alternating first and second inorganic optical layers collectively reflecting and absorbing at an incident light angle of at least one of 0°, 15°, 30°, 45°, 60°, or 75°, an average of at least 50, 60, 70, 80, 90, or 95 percent of incident ultraviolet light over at least a 30-nanometer wavelength reflection bandwidth in a wavelength range from 190 nanometers (nm) to 400 nm.

In a second embodiment is provided an ultraviolet light shielding article according to the first embodiment, wherein the alternating first and second inorganic optical layers collectively absorb at an incident light angle of at least one of 0°, 15°, 30°, 45°, 60°, or 75°, an average of at least 30, 40, 50, 60, 70, 80, 90, or 95 percent of incident light over at least a 30-nanometer wavelength bandwidth in a wavelength range from 190 nm to less than 350 nm.

In a third embodiment is provided an ultraviolet light shielding article according to the first embodiment or the second embodiment, wherein the alternating first and second inorganic optical layers collectively reflect at an incident light angle of at least one of 0°, 15°. 30°, 45°, 60°, or 75°, an average of at least 30, 40, 50, 60, 70, 80, 90, or 95 percent of incident light over at least a 30-nanometer wavelength bandwidth in a wavelength range from 190 nm to less than 400 nm, 190 nm to 240 nm, 240 nm to 300 nm, 300 nm to 350 nm, 350 nm to less than 400 nm, or any combination thereof.

In a fourth embodiment is provided an ultraviolet light shielding article according to any of the first through third embodiments, wherein the alternating first and second inorganic optical layers collectively transmit at an incident light angle of at least one of 0°, 15°, 30°, 45°, 60°, or 75°, an average of at least 50, 60, 70, 80, 90, or 95 percent of incident visible light in a wavelength range from greater than 400 nm to 700 nm.

In a fifth embodiment is provided an ultraviolet light shielding article according to any of the first through fourth embodiments, wherein the substrate transmits an average of at least 70, 80, 90, or 95 percent of incident visible light in a wavelength range from greater than 400 nm to 700 nm.

In a sixth embodiment is provided an ultraviolet light shielding article according to any of the first through fifth embodiments, wherein the substrate comprises polyethylene terephthalate (PET), a crosslinked polysiloxane, a silicone thermoplastic polymer, a crosslinked urethane, a thermoplastic urethane, a crosslinked (meth)acrylate, PMMA, coPMMA, a polyimide, a cyclic olefin copolymer, a cyclic olefin polymer, a polycarbonate, PEN, or a fluoropolymer (co)polymer comprising polymerized units derived from one or more monomers selected from tetrafluoroethylene, hexafluoropropylene, vinylidene fluoride, a perfluoroalkoxy alkylene, a vinyl fluoride, or a combination thereof.

In a seventh embodiment is provided an ultraviolet light shielding article according to any of the first through sixth embodiments, wherein the first optical layer comprises at least one of niobium oxide, titanium oxide, silicon oxynitride, molybdenum oxide, tungsten oxide, silicon nitride, indium tin oxide, hafnium oxide, tantalum oxide, zirconium oxynitride, zirconium oxide, aluminum zinc oxide, or zinc oxide and wherein the second optical layer comprises at least one of silicon oxide, aluminum oxide, aluminum fluoride, magnesium fluoride, calcium fluoride, indium tin oxide, or zinc oxide.

In an eighth embodiment is provided an ultraviolet light shielding article according to any of the first through seventh embodiments, wherein the first optical layer comprises at least one of niobium oxide or titanium oxide, and wherein the second optical layer comprises silicon oxide.

In a ninth embodiment is provided an ultraviolet light shielding article of any of the first through eighth embodiments, wherein the outermost optical layer is a second optical layer and has a thickness of at least 70 nm.

In a tenth embodiment is provided an ultraviolet light shielding article of any of the first through ninth embodiments, wherein at least one of the first optical layers nearest to the exterior of the film or nearest to the substrate has a thickness of at most 95%, 90%, 85%, or at most 80% of the other first optical layers.

In an eleventh embodiment is provided an ultraviolet light shielding article according to any of the first through tenth embodiments, wherein the multilayer optical film has a thickness of 200 nm to 900 nm.

In a twelfth embodiment is provided an ultraviolet light shielding article according to any of the first through eleventh embodiments, wherein each of the first and second optical layers independently has a thickness of 5 nm to 200 nm.

In a thirteenth embodiment is provided an ultraviolet light shielding article according to any of the first through twelfth embodiments, wherein the multilayer optical film is formed of 3 to 21 total first and second optical layers.

In a fourteenth embodiment is provided an ultraviolet light shielding article according to any of the first through thirteenth embodiments, wherein the plurality of alternating first and second inorganic optical layers collectively reflect and absorb at an incident light angle of at least one of 0°, 15°, 30°, 45°, 60°, or 75°, an average of at least 80, 90, or 95 percent of incident ultraviolet light over at least a 30-nanometer wavelength reflection bandwidth in a wavelength range from 190 nm to 400 nm.

In a fifteenth embodiment is provided an ultraviolet light shielding article according to any of the first through fourteenth embodiments, wherein the plurality of alternating first and second inorganic optical layers collectively reflect and absorb at an incident light angle of at least one of 0°, 15°, 30°, 45°, 60°, or 75°, an average of at least 60, 70, 80, 90, or 95 percent of incident ultraviolet light over at least a 30-nanometer wavelength reflection bandwidth in a wavelength range from 190 nm to 240 nm, 240 nm to 300 nm, 300 nm to 350 nm, 350 nm to 400 nm, or any combination thereof.

In a sixteenth embodiment is provided an ultraviolet light shielding article according to any of the first through fifteenth embodiments, wherein the plurality of alternating first and second inorganic optical layers collectively reflect and absorb at an incident light angle of at least one of 0°, 15°, 30°, 45°, 60°, or 75°, an average of at least 60, 70, 80, 90, or 95 percent of incident ultraviolet light over at least a 50-nanometer, 75-nanometer, 100-nanometer, 125-nanometer, 150-nanometer, or 175-nanometer wavelength reflection bandwidth in a wavelength range from 190 nm to 400 nm.

In a seventeenth embodiment is provided an ultraviolet light shielding article according to any of the first through sixteenth embodiments, which transmits at an incident light angle of at least one of 0°, 15°, 30°, 45°, 60°, or 75°, an average of at least 50, 60, 70, 80, 90, or 95 percent of incident visible light in a wavelength range from greater than 400 nm to 700 nm.

In an eighteenth embodiment is provided an ultraviolet light shielding article according to any of the first through seventeenth embodiments, wherein an average transmission of wavelengths between 400 nm and 700 nm through the article is reduced by less than 20%, 10%, 5%, or less than 1% after exposure to a certain dose of ultraviolet light.

In a nineteenth embodiment is provided a solar cell cover. The solar cell cover comprises the ultraviolet light shielding article according to of any of the first through eighteenth embodiments.

EXAMPLES

Unless otherwise noted or readily apparent from the context, all parts, percentages, ratios, etc. in the Examples and the rest of the specification are by weight.
Materials Used in the Examples

| Abbreviation | Description and Source |
|---|---|
| PET | Polyethylene terephthalate substrate film, obtained under tradename "Melinex ST504" from DuPont Teijin Films; Chester, VA |

-continued

| Abbreviation | Description and Source |
|---|---|
| $TiO_2$ | $TiO_2$ source material was purchased under trade name "Titanium Oxide tablets, $TiO_2$, 99.9% pure" from Kurt J Lesker Company; Jefferson Hills, PA. |
| $SiO_2$ | $SiO_2$ source material was purchased under trade name "Silicon Oxide Pieces, $SiO_2$, 99.99% pure" from Kurt J Lesker Company; Jefferson Hills, PA. |
| BK7 | 21.57 mm by 21.57 mm by 1.5 mm BK7 glass, obtained under tradename "BK7 Chips" from Eddy Company; Apple Valley, CA |
| Silicon chip | Silicon wafers cut into 0.75" × 0.75" pieces, obtained under part number "452" from University Wafer Inc; South Boston, MA |

Test Methods

Spectral Properties Measurement Test: The spectral transmission and reflection of free-standing examples of light shielding articles were measured using a spectrophotometer (obtained under the trade designation "LAMBDA 1050" from PerkinElmer, Inc., Waltham, MA).

Absorption was calculated (in units of percentage) as 100-Reflection-Transmission. The measured spectral reflection, absorption, and transmission are reported as an average percent over a wavelength range in the Reflection and Absorption Results Table and Transmission Results Table.

In the case of Comparative Examples 2 and 3, the coatings on the PET substrates do not fully block the UV wavelengths of light below 400 nm where the absorption by PET substrates becomes significant. In these cases, some light is absorbed by the PET substrate in addition to the absorption that occurs in the optical coatings, and the measured absorption therefore includes contributions from both the PET substrate and the optical coating, whereas the purpose of the test is to assess the absorption of only the optical coatings. To account for the PET substrate absorption, the absorption by the PET was estimated by multiplying the modeled transmission of the optical coatings (see Spectral Properties Modeling Test section below) by the measured absorption of an uncoated PET substrate, and dividing this product by 100 (to maintain units of %). This is reported as the Modeled PET A (%) in the Reflection and Absorption Results Table. This modeled PET absorption spectrum was then subtracted from the measured absorption spectrum of Comparative Examples 2 and 3 to calculate a more accurate representation of the measured absorption of the optical coatings, which is reported as the Corrected Measured A (%) in the Reflection and Absorption Results Table.

Spectral Properties Modeling Test: As noted above, in some cases the substrate impacts the spectral properties of measured films, especially the transmission and absorption in the case of UV absorbing substrates like PET. To provide an accurate representation of the transmission and absorption of the multilayer optical coatings without the impact of the substrate, the reflection, transmission, and absorption of the inorganic coatings have also been modeled. To perform this modeling. Test Samples 1 and 2 were measured with an ellipsometer (obtained under trade name "RC2 Ellipsometer" from J. A. Woolam: Lincoln, NE) to determine the spectral index of refraction (n) and extinction coefficient (k) values of the evaporated $TiO_2$ and $SiO_2$ samples. All structures were modeled with a PET substrate, except for the modeling of Comparative Example 1, where the software provided material "Glass" was used to model the substrate. Then the n and k obtained above were input into optical modeling software (obtained under trade name "Essential MaCleod" from The Thin Film Center: Tucson, AZ) and used to compute the reflection, transmission, and absorption spectra for the multilayer optical films prepared as described below. The results of the reflection, absorption, and transmission modeling are reported as an average percent over a wavelength range in the Reflection and Absorption Results Table and Transmission Results Table. Note that the modeling only calculates the transmission, reflection, and absorption of the optical coatings: the modeling does not calculate the absorption or back surface reflection of the substrate material.

Solar Aging Test: Samples were exposed in an Atlas Ci5000 Weather-Ometer (obtained from AMETEK, Berwyn, PA) using a xenon arc lamp equipped with quartz inner and outer filters. The quartz filter set provides minimal attenuation to the spectral power distribution of the xenon lamp, which gives a close approximation to the shape of solar output (ASTM E490). To increase the rate at which dosage is accumulated, the samples were exposed on custom-made stainless steel and aluminum extended holders. The extended holders move the exposure plane from 19 inches (48.3 cm) away from the core of the lamp to 13.5 inches (34.3 cm) from the core of the lamp. Irradiance was controlled at 1.5 watts per square meter ($W/m^2$) at 340 nm at the rack plane and was measured to be 2.6 $W/m^2$ at 340 nm at the extended sample plane. Ambient air temperature inside the Weatherometer was controlled at 48° C., a black-panel thermometer (BPT) was controlled at 75° C. at the rack plane and measured to be approximately 95° C. at the sample plane, and relative humidity was controlled at 30%. Samples were exposed without any backing. Samples were exposed to a dose of 425 megajoules per square meter ($MJ/m^2$) and 850 $MJ/m^2$ cumulative irradiance from 250-385 nm.

The change in transmission was calculated as $$\% \text{ reduction in transmission} = \frac{T_{Fresh} - T_{Aged}}{T_{Fresh}}$$

where $T_{fresh}$ is the average transmission from 400-700 nm before solar aging, and $T_{aged}$ is the average transmission from 400-700 nm after the above exposure. The results of the Solar Aging Test are summarized in the Solar Aging Results Table.

Flexibility Test: Samples were tested for flexibility by wrapping the films around a metal mandrel with a diameter of 0.5" (1.27 cm), with the coated side facing away from the mandrel. The Spectral Properties Test was performed both before and after wrapping the samples around the mandrel. The percent change in spectral value was calculated as $$\% \text{ change in spectra} = \frac{\sum |S_{Unwrapped}(\lambda) - S_{Wrapped}(\lambda)|}{\sum S_{Unwrapped}(\lambda)}$$

where $S(\lambda)$ is the measured value of the spectra, in units of percentage, at a given measured wavelength. The summations were performed over all wavelengths measured in the range 200 to 700 nm. This calculation was performed separately for the transmission, reflection, and absorption spectra. The calculated percent changes in spectra after wrapping are reported below in the Flexibility Test Results Table below.

Test Samples

Test Sample 1: A 70 nm-thick $TiO_2$ layer was deposited on a silicon chip in the following manner: the vapor coater used was a Denton Vacuum Optical Coater consisting of a 5-planet planetary drive system located ~30" (76.2 cm) above a 4-pocket Temescal Electron Beam gun (obtained from Ferro Tec Corporation, Livermore, CA). The planetary drive system was designed to hold the substrate perpendicular to the evaporation source and to move that disk in a planetary type motion in and out of the evaporation plume during the deposition. The actual process for the coating consisted of: a) The vapor coater was vented to atmosphere and one the five planets was removed. The substrate was prepared for coating by adhering/taping it to the planet by a polyimide tape. b) The planet was reinstalled, and the other 4 planets were configured similarly, if needed, and they too were reinstalled in the coater. c) The chamber was closed and pumped to a vacuum level of $<2\times10^{-5}$ Torr ($2.7\times10^{-3}$ Pa). d) When the vapor coater was at a low enough vacuum, the material was ion beam treated using a Kaufman-type ion source for ~10 minutes at a voltage of 400V as a pretreatment to the substrate for adhesion of the vapor deposited coating to the substrate prior to applying the oxide films. e) Oxygen gas was added via a MKS mass flow controller (obtained from MKS Instruments, Inc., Andover, MA) to obtain a pressure of $4.0\times10^{-5}$ Torr ($5.3\times10-3$ Pa). This was usually about 10 standard cubic centimeters per minute (sccms) for added oxygen gas. f) The planetary drive system was started and moved around the coater at a rotational speed of ~60 rpm to prepare for coating and to achieve a high level of uniformity on the attached substrates. g) A Temescal electron beam gun (e-gun) power supply was energized. A voltage of 10 kV and a current of a few milliamps was applied to the e-gun's filament, heating the source material in the e-gun. The source was heated and controlled via an Eddy Company Optical Monitoring System (OMS) (from Eddy Company, Apple Valley, CA). The source was heated until the desired deposition rate of the material was achieved: in the case of $TiO_2$ this rate was 2 angstroms per second (A/s), and in the case of $SiO_2$ this was 4 A/s. When the desired deposition rate of the material was achieved and steady, a shutter that separates the source from the planets was opened and the rate was maintained via the OMS until the desired optical thickness was achieved, at which point the shutter closed and the OMS shuts power off to the e-beam source. h) The main power to the power supply was turned off and the source allowed to cool for about 10 minutes. i) This process was repeated for additional layers/types of material until the full desired multilayer optical film had been deposited. j) The chamber was then vented back to atmospheric pressure via $N_2$ gas and each planet was removed and the substrate was removed from each planet.

Test Sample 2: a 115 nm-thick $SiO_2$ layer was deposited on a silicon chip in the same manner as Test Sample 1.

Examples

Example 1: A vapor coated multilayer optical film was prepared on a PET substrate in the same manner as Test Sample 1, except a PET film was used for the substrate, and the structure deposited on the PET substrate is summarized in the Examples Structure Table below. The PET substrate used for these samples was pretreated by the supplier on one side to promote adhesion of other materials to the substrate; the substrate was taped to the planet such that the non-pretreated side of the PET would be coated by the vapor coating process.

Example 2: Example 2 was prepared in the same manner as Example 1, except that the layer thicknesses are as described in the Examples Structure Table below.

Comparative Examples

Comparative example 1: Comparative example 1 was prepared in the same manner as Example 1, except instead of a PET substrate a piece of BK7 glass substrate was coated.

Comparative example 2: Comparative example 2 was prepared in the same manner as Example 1, except that the layer thicknesses were as described in the Examples Structure Table below.

Comparative example 3: Comparative Example 3 was prepared in the same manner as Example 1, except that the layer thicknesses are as described in the Examples Structure Table below.

| | Examples Structure Table (Layer 1 is in contact with the substrate.) | | | | |
|---|---|---|---|---|---|
| Sample | Example 1 | Example 2 | Comparative Example 1 | Comparative Example 2 | Comparative Example 3 |
| Substrate | PET | PET | BK7 | PET | PET |
| Layer 1 | $SiO_2$/58.8 nm | $SiO_2$/22.6 nm | $SiO_2$/58.8 nm | $SiO_2$/58.8 nm | $TiO_2$/200 nm |
| Layer 2 | $TiO_2$/36.1 nm | $TiO_2$/20.0 nm | $TiO_2$/36.1 nm | $TiO_2$/36.1 nm | |
| Layer 3 | $SiO_2$/58.8 nm | $SiO_2$/47.6 nm | $SiO_2$/58.8 nm | | |
| Layer 4 | $TiO_2$/36.1 nm | $TiO_2$/32.2 nm | $TiO_2$/36.1 nm | | |
| Layer 5 | $SiO_2$/58.8 nm | $SiO_2$/47.6 nm | $SiO_2$/58.8 nm | | |
| Layer 6 | $TiO_2$/36.1 nm | $TiO_2$/32.2 nm | $TiO_2$/36.1 nm | | |
| Layer 7 | $SiO_2$/58.8 nm | $SiO_2$/47.6 nm | $SiO_2$/58.8 nm | | |
| Layer 8 | $TiO_2$/36.1 nm | $TiO_2$/32.2 nm | $TiO_2$/36.1 nm | | |
| Layer 9 | $SiO_2$/58.8 nm | $SiO_2$/47.6 nm | $SiO_2$/58.8 nm | | |
| Layer 10 | $TiO_2$/36.1 nm | $TiO_2$/20.0 nm | $TiO_2$/36.1 nm | | |
| Layer 11 | | $SiO_2$/134.4 nm | | | |

Flexibility Test Results Table

| Sample | % change in spectra after bend | | |
|---|---|---|---|
| | % Reflection | % Transmission | % Absorption |
| Example 1 | 0.4 | 0.1 | 0.6 |
| Example 2 | 0.9 | 0.1 | 0.9 |
| Comparative Example 1 | Not flexible enough to be wrapped around mandrel | | |
| Comparative Example 2 | 0.2 | 0.1 | 0.3 |
| Comparative Example 3 | 0.5 | 0.1 | 0.6 |

Solar Aging Results Table

| | % reduction in average transmission 400-700 nm | |
|---|---|---|
| | 425 MJ/cm$^2$ Dose | 850 MJ/cm$^2$ Dose |
| Example 1 | 4.2 | 5.9 |
| Example 2 | 4.0 | 6.6 |
| Comparative Example 1 | N/A | N/A |
| Comparative Example 2 | 13.3 | 31.7 |
| Comparative Example 3 | 26.3 | 21.8 |

Reflection and Absorption Results Table (Measured values were obtained from light shielding articles. Modeled values are from simulations of the inorganic coatings only.)

| | | Wavelength range (nm) | | | | | |
|---|---|---|---|---|---|---|---|
| | | 200-400 | 200-350 | 200-240 | 240-300 | 300-350 | 350-400 |
| Example 1 | Measured R (%) | 43 | 28 | 24 | 23 | 37 | 87 |
| | Modeled R (%) | 51 | 37 | 19 | 24 | 63 | 96 |
| | Measured A (%) | 54 | 70 | 76 | 77 | 58 | 6 |
| | Modeled A (%) | 48 | 63 | 81 | 76 | 36 | 1 |
| Example 2 | Measured R (%) | 42 | 36 | 26 | 30 | 52 | 62 |
| | Modeled R (%) | 39 | 42 | 37 | 25 | 66 | 35 |
| | Measured A (%) | 49 | 63 | 74 | 70 | 47 | 8 |
| | Modeled A (%) | 44 | 57 | 63 | 75 | 33 | 4 |
| Comparative Example 1 | Measured R (%) | 48 | 32 | 23 | 23 | 48 | 99 |
| | Modeled R (%) | 51 | 37 | 19 | 24 | 63 | 96 |
| | Measured A (%) | 50 | 67 | 77 | 77 | 48 | 0 |
| | Modeled A (%) | 48 | 63 | 81 | 76 | 36 | 1 |
| Comparative Example 2 | Measured R (%) | 23 | 20 | 18 | 18 | 22 | 33 |
| | Modeled R (%) | 33 | 30 | 21 | 27 | 40 | 42 |
| | Measured A (%) | 54 | 70 | 82 | 82 | 49 | 6 |
| | Modeled PET A (%) | 11 | 14 | 11 | 16 | 16 | 2 |
| | Corrected Measured A (%) | 43 | 56 | 71 | 66 | 33 | 4 |
| | Modeled A (%) | 35 | 47 | 67 | 56 | 20 | 1 |
| Comparative Example 3 | Measured R (%) | 23 | 25 | 24 | 26 | 24 | 20 |
| | Modeled R (%) | 23 | 23 | 22 | 24 | 22 | 23 |
| | Measured A (%) | 56 | 71 | 76 | 74 | 63 | 14 |
| | Modeled PET A (%) | 2 | 1 | 0 | 0 | 3 | 3 |
| | Corrected Measured A (%) | 55 | 70 | 76 | 74 | 60 | 10 |
| | Modeled A (%) | 54 | 70 | 78 | 76 | 58 | 6 |

Transmission Results Table

| | Transmission (%) 400-700 nm | |
|---|---|---|
| | Modeled multilayer optical film | Measured light shielding article |
| Example 1 | 81 | 70 |
| Example 2 | 97 | 91 |
| Comparative Example 1 | 81 | 65 |
| Comparative Example 2 | 79 | 76 |
| Comparative Example 3 | 83 | 79 |

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

Furthermore, all publications and patents referenced herein are incorporated by reference in their entirety to the same extent as if each individual publication or patent was specifically and individually indicated to be incorporated by reference. In the event of inconsistencies or contradictions between portions of the incorporated references and this application, the information in the preceding description. Various exemplary embodiments have been described. These and other embodiments are within the scope of the following claims.

What is claimed is:

1. An ultraviolet light shielding article comprising:
a) a flexible substrate having a major surface; and
b) a multilayer optical film disposed on the major surface of the substrate, wherein the multilayer optical film is comprised of at least a plurality of alternating first and second inorganic optical layers collectively reflecting and absorbing at an incident light angle of at least one of 0°, 15°, 30°, 45°, 60°, or 75°, an average of at least 50, 60, 70, 80, 90, or 95 percent of incident ultraviolet light over at least a 30-nanometer wavelength reflection bandwidth in a wavelength range from 190 nanometers (nm) to 400 nm, wherein the outermost optical layer is a second optical layer and has a thickness of at least 70 nm, and wherein at least one of the first optical layers nearest to the exterior of the film or nearest to the substrate has a thickness of at most 95%, 90%, 85%, or at most 80% of the other first optical layers,
wherein the ultraviolet light shielding article transmits at an incident light angle of at least one of 0°, 15°, 30°, 45°, 60°, or 75°, an average of at least 90 percent of incident visible light in a wavelength range from greater than 400 nm to 700 nm.

2. The ultraviolet light shielding article of claim 1, wherein the alternating first and second inorganic optical layers collectively absorb at an incident light angle of at least one of 0°, 15°, 30°, 45°, 60°, or 75°, an average of at least 30, 40, 50, 60, 70, 80, 90, or 95 percent of incident light over at least a 30-nanometer wavelength bandwidth in a wavelength range from 190 nm to less than 350 nm.

3. The ultraviolet light shielding article of claim 1, wherein the alternating first and second inorganic optical layers collectively reflect at an incident light angle of at least one of 0°, 15°, 30°, 45°, 60°, or 75°, an average of at least 30, 40, 50, 60, 70, 80, 90, or 95 percent of incident light over at least a 30-nanometer wavelength bandwidth in a wavelength range from 190 nm to less than 400 nm, 190 nm to 240 nm, 240 nm to 300 nm, 300 nm to 350 nm, 350 nm to less than 400 nm, or any combination thereof.

4. The ultraviolet light shielding article of claim 1, wherein the alternating first and second inorganic optical layers collectively transmit at an incident light angle of at least one of 0°, 15°, 30°, 45°, 60°, or 75°, an average of at least 50, 60, 70, 80, 90, or 95 percent of incident visible light in a wavelength range from greater than 400 nm to 700 nm.

5. The ultraviolet light shielding article of claim 1, wherein the substrate transmits an average of at least 70, 80, 90, or 95 percent of incident visible light in a wavelength range from greater than 400 nm to 700 nm.

6. The ultraviolet light shielding article of claim 1, wherein the substrate comprises polyethylene terephthalate (PET), a crosslinked polysiloxane, a silicone thermoplastic polymer, a crosslinked urethane, a thermoplastic urethane, a crosslinked (meth)acrylate, PMMA, coPMMA, a polyimide, a cyclic olefin copolymer, a cyclic olefin polymer, a polycarbonate, PEN, or a fluoropolymer (co)polymer comprising polymerized units derived from one or more monomers selected from tetrafluoroethylene, hexafluoropropylene, vinylidene fluoride, a perfluoroalkoxy alkylene, a vinyl fluoride, or a combination thereof.

7. The ultraviolet light shielding article of claim 1, wherein the first optical layer comprises at least one of niobium oxide, titanium oxide, silicon oxynitride, molyb-denum oxide, tungsten oxide, silicon nitride, indium tin oxide, hafnium oxide, tantalum oxide, zirconium oxynitride, zirconium oxide, aluminum zinc oxide, or zinc oxide and wherein the second optical layer comprises at least one of silicon oxide, aluminum oxide, aluminum fluoride, magnesium fluoride, calcium fluoride, indium tin oxide, or zinc oxide.

8. The ultraviolet light shielding article of claim 1, wherein the first optical layer comprises at least one of niobium oxide or titanium oxide, and wherein the second optical layer comprises silicon oxide.

9. The ultraviolet light shielding article of claim 1, wherein the multilayer optical film has a thickness of 200 nm to 900 nm.

10. The ultraviolet light shielding article of claim 1, wherein each of the first and second optical layers independently has a thickness of 5 nm to 200 nm.

11. The ultraviolet light shielding article of claim 1, wherein the multilayer optical film is formed of 3 to 21 total first and second optical layers.

12. The ultraviolet light shielding article of claim 1, wherein the plurality of alternating first and second inorganic optical layers collectively reflect and absorb at an incident light angle of at least one of 0°, 15°, 30°, 45°, 60°, or 75°, an average of at least 80, 90, or 95 percent of incident ultraviolet light over at least a 30-nanometer wavelength reflection bandwidth in a wavelength range from 190 nm to 400 nm.

13. The ultraviolet light shielding article of claim 1, wherein the plurality of alternating first and second inorganic optical layers collectively reflect and absorb at an incident light angle of at least one of 0°, 15°, 30°, 45°, 60°, or 75°, an average of at least 60, 70, 80, 90, or 95 percent of incident ultraviolet light over at least a 30-nanometer wavelength reflection bandwidth in a wavelength range from 190 nm to 240 nm, 240 nm to 300 nm, 300 nm to 350 nm, 350 nm to 400 nm, or any combination thereof.

14. The ultraviolet light shielding article of claim 1, wherein the plurality of alternating first and second inorganic optical layers collectively reflect and absorb at an incident light angle of at least one of 0°, 15°, 30°, 45°, 60°, or 75°, an average of at least 60, 70, 80, 90, or 95 percent of incident ultraviolet light over at least a 50-nanometer, 75-nanometer, 100-nanometer, 125-nanometer, 150-nanometer, or 175-nanometer wavelength reflection bandwidth in a wavelength range from 190 nm to 400 nm.

15. The ultraviolet light shielding article of claim 1, which transmits at an incident light angle of at least one of 0°, 15°, 30°, 45°, 60°, or 75°, an average of at least 50, 60, 70, 80, 90, or −95 percent of incident visible light in a wavelength range from greater than 400 nm to 700 nm.

16. The ultraviolet light shielding article of claim 1, wherein an average transmission of wavelengths between 400 nm and 700 nm through the article is reduced by less than 20%, 10%, 5%, or less than 1% after exposure to a dose of ultraviolet light of 425 megajoules per square centimeter (MJ/cm$^2$) or 850 MJ/cm$^2$.

17. A solar cell cover comprising the ultraviolet light shielding article of claim 1.

* * * * *